(12) United States Patent
Kobayashi et al.

(10) Patent No.: US 9,228,685 B2
(45) Date of Patent: Jan. 5, 2016

(54) LOAD LOCK DEVICE

(75) Inventors: Sensho Kobayashi, Yamanashi (JP);
Keita Kumagai, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 289 days.

(21) Appl. No.: 13/992,148

(22) PCT Filed: Nov. 30, 2011

(86) PCT No.: PCT/JP2011/077635
§ 371 (c)(1),
(2), (4) Date: Jun. 6, 2013

(87) PCT Pub. No.: WO2012/077547
PCT Pub. Date: Jun. 14, 2012

(65) Prior Publication Data
US 2013/0248014 A1    Sep. 26, 2013

(30) Foreign Application Priority Data

Dec. 9, 2010   (JP) .................................. 2010-274691

(51) Int. Cl.
*H01L 21/67*    (2006.01)
*F16L 53/00*    (2006.01)
*C23C 16/44*    (2006.01)

(52) U.S. Cl.
CPC .............. *F16L 53/00* (2013.01); *C23C 16/4408* (2013.01); *H01L 21/67109* (2013.01); *H01L 21/67201* (2013.01); *Y10T 137/6416* (2015.04)

(58) Field of Classification Search
CPC ................... H01L 21/67109; H01L 21/67201; C23C 16/4408
See application file for complete search history.

(56) References Cited

U.S. PATENT DOCUMENTS

| 6,672,864 B2 * | 1/2004 | Wang et al. ........................ 432/5 |
| 7,229,666 B2 * | 6/2007 | Mardian et al. ............ 427/248.1 |
| 2003/0103836 A1 | 6/2003 | Adams |

(Continued)

FOREIGN PATENT DOCUMENTS

| JP | 02-229429 A | 9/1990 |
| JP | 06-158284 A | 6/1994 |
| JP | 7-230959 A | 5/1995 |
| JP | 2000-208589 A | 7/2000 |
| JP | 2004-228562 A | 8/2004 |

(Continued)

OTHER PUBLICATIONS

International Search Report from International Application No. PCT/JP2011/077635 mailed Feb. 14, 2012.

*Primary Examiner* — Kevin Murphy
(74) *Attorney, Agent, or Firm* — Brundidge & Stanger, P.C.

(57) ABSTRACT

A load lock device includes a vessel of which an internal pressure is variable between a pressure corresponding to a vacuum chamber and an atmospheric pressure; a purge gas supply source configured to supply a purge gas into the vessel; an exhaust device configured to evacuate an inside of the vessel; a pressure controller configured to adjust the internal pressure of the vessel to be the pressure corresponding to the vacuum chamber and the atmospheric pressure; a cooling member within the vessel configured to cool a substrate while the substrate is placed adjacent thereto; a first purge gas discharging member configured to discharge the purge gas to flow in parallel with the substrate while controlling a turbulent flow thereof; and a second purge gas discharging member formed of a porous material and configured to discharge the purge gas toward a bottom surface of the substrate from below the substrate.

12 Claims, 8 Drawing Sheets

(56) References Cited

U.S. PATENT DOCUMENTS

2004/0118343 A1 6/2004 Murphy
2008/0128871 A1 6/2008 Schropp
2010/0236478 A1* 9/2010 Miyashita et al. ............ 118/719
2010/0326637 A1 12/2010 Sasaki et al.

FOREIGN PATENT DOCUMENTS

| JP | 2006-501632 A | 1/2006 |
| JP | 2007-035874 A | 2/2007 |
| JP | 2007-528940 A | 10/2007 |
| JP | 2009-182235 A | 8/2009 |

* cited by examiner

US 9,228,685 B2

LOAD LOCK DEVICE

CROSS REFERENCE TO RELATED APPLICATION

This Application is a U.S. national phase application under 35 U.S.C. §371 of PCT Application NO. PCT/JP2011/077635 filed Nov. 30, 2011, which claims the benefit of Japanese Patent Application No. 2010-274691 filed on Dec. 9, 2010, the entire disclosures of which are incorporated herein by reference.

TECHNICAL FIELD

The present disclosure relates a load lock device used in a vacuum processing apparatus that performs a vacuum process on a processing target substrate such as a semiconductor wafer.

BACKGROUND ART

In a semiconductor device manufacturing process, various vacuum processes such as a film forming process and an etching process are performed on a semiconductor wafer as a processing target substrate (hereinafter, simply referred to as a "wafer") in a vacuum atmosphere. Recently, in order to improve efficiency of the vacuum process and suppress oxidation or contamination, there has been used a multi-chamber vacuum processing system of a cluster tool type. In the multi-chamber vacuum processing system, a multiple number of vacuum processing units are connected to a transfer chamber which is maintained in a vacuum state and the wafer is transferred into each of the vacuum processing units by a transfer device which is provided in the transfer chamber (see, for example, Patent Document 1).

In such a multi-chamber processing system, in order to transfer the wafer from a wafer cassette which is placed in an atmosphere state into the transfer chamber which is maintained in the vacuum state, a load lock device (load lock chamber) is provided between the transfer chamber and the wafer cassette. The wafer is transferred via the load lock device.

Meanwhile, when a high-temperature process such as a film forming process is performed in this multi-chamber processing system, the wafer may be taken out of the vacuum processing unit and transferred into a vessel in the load lock device while a wafer temperature becomes a high temperature over, e.g., about 500° C. If, however, the wafer having such a high temperature is exposed to the atmosphere, the wafer may be oxidized. Further, if this high-temperature wafer is accommodated in an accommodation vessel, the accommodation vessel, which is typically formed of a resin, may be damaged.

In order to solve these problems, a cooling plate having a cooling device for cooling the wafer is provided within the vessel of the load lock device. The wafer is placed close to the cooling plate, and the wafer is cooled by the cooling plate while an inside of the load lock device is returned back to an atmosphere state from the vacuum state.

Patent Document 1: Japanese Patent Laid-open Publication No. 2000-208589

DISCLOSURE OF THE INVENTION

Problems to Be Solved by the Invention

When cooling the wafer as mentioned above, if the wafer is rapidly cooled, the wafer may be bent due to a difference in thermal expansion between a front surface and a rear surface of the wafer. Thus, immediately after the high-temperature wafer is loaded into the load lock device, the wafer needs to stand by at a position far above the cooling plate. Then, the wafer is cooled at a low cooling rate that does not cause the wafer to be bent. Accordingly, it takes a long time to cool the wafer, and since the wafer cooling time in the load lock device determines a processing rate of the entire processing system, a throughput may be deteriorated.

Meanwhile, in order to return back the inside of the load lock device from the vacuum state to the atmospheric state, a purge gas such a $N_2$ gas is introduced into the vessel of the load lock device. Here, it may be possible to cool the wafer by using this purge gas. If, however, the purge gas is introduced into a vicinity of the wafer in order to cool the wafer efficiently, particles may be blown up and adhere to the wafer. In order to prevent the particles from adhering to the wafer, the purge gas needs to be supplied from a position in the vessel far from the wafer. For this reason, it is difficult to cool the wafer efficiently.

In view of the foregoing problems, illustrative embodiments provide a load lock device capable of improving the throughput of the substrate process by cooling the high-temperature substrate efficiently while suppressing particles from adhering to the substrate.

Means for Solving the Problems

In accordance with a first aspect of an illustrative embodiment, there is provided a load lock device used when a substrate is transferred from an atmospheric atmosphere into a vacuum chamber maintained in a vacuum state and when the high-temperature substrate is transferred from the vacuum chamber into the atmospheric atmosphere. The load lock device includes a vessel of which an internal pressure is variable between a pressure corresponding to the vacuum chamber and an atmospheric pressure; a purge gas supply unit configured to supply a purge gas into the vessel; an exhaust device configured to evacuate an inside of the vessel; a pressure controller configured to adjust the internal pressure of the vessel to be the pressure corresponding to the vacuum chamber when the inside of the vessel communicates with the vacuum chamber and configured to adjust the internal pressure of the vessel to be the atmospheric pressure when the inside of the vessel communicates with a space under the atmospheric atmosphere by controlling the purge gas supply unit and the exhaust device; a cooling member, having a cooling device, provided within the vessel and configured to cool the substrate while the substrate is placed adjacent thereto; a first purge gas discharging member configured to discharge the purge gas supplied from the purge gas supply unit to flow in parallel with the substrate while controlling a turbulent flow of the purge gas; and a second purge gas discharging member formed of a porous material and configured to discharge the purge gas toward a bottom surface of the substrate from below the substrate placed adjacent to the cooling member.

In accordance with a second aspect of the illustrative embodiment, there is provided a load lock device used when a substrate is transferred from an atmospheric atmosphere into a vacuum chamber maintained in a vacuum state and when the high-temperature substrate is transferred from the vacuum chamber into the atmospheric atmosphere. The load lock device includes a vessel of which an internal pressure is variable between a pressure corresponding to the vacuum chamber and an atmospheric pressure; a purge gas supply unit configured to supply a purge gas into the vessel; an exhaust device configured to evacuate an inside of the vessel; a pressure controller configured to adjust the internal pressure of the vessel to be the pressure corresponding to the vacuum chamber when the inside of the vessel communicates with the vacuum chamber and configured to adjust the internal pressure of the vessel to be the atmospheric pressure when the inside of the vessel communicates with a space under the atmospheric atmosphere by controlling the purge gas supply unit and the exhaust device; a cooling member, having a cooling device, provided within the vessel and configured to cool the substrate while the substrate is placed adjacent thereto; and a purge gas discharging member formed of a porous material and configured to discharge the purge gas toward a bottom surface of the substrate from below the substrate placed adjacent to the cooling member.

In accordance with a third aspect of the illustrative embodiment, there is provided a load lock device used when a substrate is transferred from an atmospheric atmosphere into a vacuum chamber maintained in a vacuum state and when the high-temperature substrate is transferred from the vacuum chamber into the atmospheric atmosphere. The load lock device includes a vessel of which an internal pressure is variable between a pressure corresponding to the vacuum chamber and an atmospheric pressure; a purge gas supply unit configured to supply a purge gas into the vessel; an exhaust device configured to evacuate an inside of the vessel; a pressure controller configured to adjust the internal pressure of the vessel to be the pressure corresponding to the vacuum chamber when the inside of the vessel communicates with the vacuum chamber and configured to adjust the internal pressure of the vessel to be the atmospheric pressure when the inside of the vessel communicates with a space under the atmospheric atmosphere by controlling the purge gas supply unit and the exhaust device; a cooling member, having a cooling device, provided within the vessel and configured to cool the substrate while the substrate is placed adjacent thereto; and a purge gas discharging member configured to discharge the purge gas supplied from the purge gas supply unit to flow in parallel with the substrate while controlling a turbulent flow of the purge gas. Further, the purge gas discharging member may include a discharging unit formed of a porous material and configured to discharge the purge gas, and the discharging unit may be disposed so as to form a flow of the discharged purge gas over an entire area of the substrate while controlling the turbulent flow the purge gas.

BEST MODE FOR CARRYING OUT THE INVENTION

Hereinafter, illustrative embodiments will be described in detail with reference to the accompanying drawings.

(Vacuum Processing System Having a Load Lock Device in Accordance With an Illustrative Embodiment)

Figure 1:
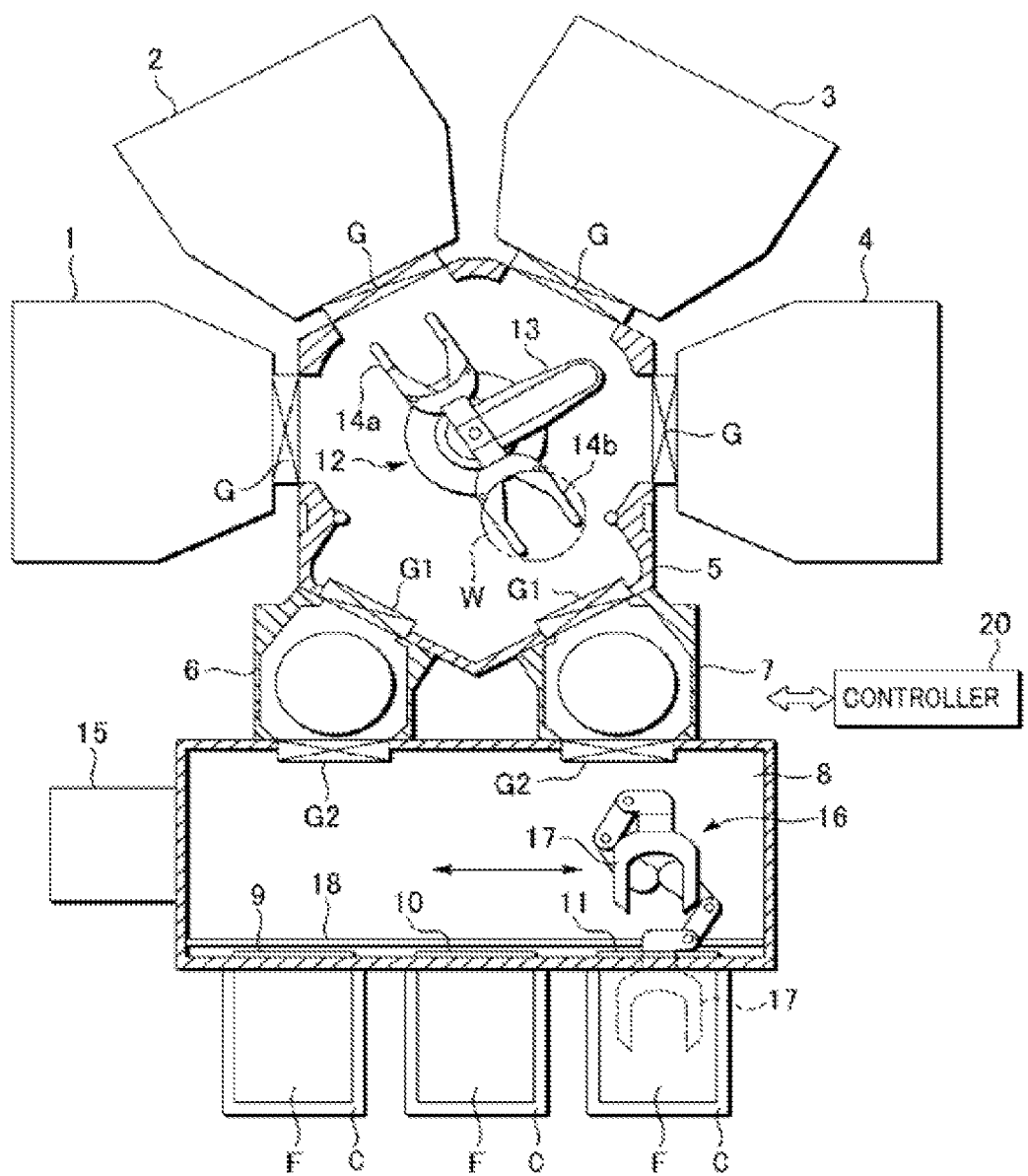
FIG. 1 is a transversal cross sectional view illustrating a schematic configuration of a multi-chamber vacuum processing system in which a load lock device in accordance with an illustrative embodiment is provided.

FIG. 1 is a transversal cross sectional view illustrating a schematic configuration of a multi-chamber vacuum processing system having the load lock device in accordance with the illustrative embodiment.

The vacuum processing system includes four vacuum processing units 1, 2, 3, and 4, each of which is configured to perform a high-temperature process, e.g., a film forming process. The vacuum processing units 1 to 4 are connected to four sides of a hexagonal transfer chamber 5, respectively. Further, load lock devices 6 and 7 in accordance with the present illustrative embodiment are connected to the other two sides of the transfer chamber 5, respectively. A loading/unloading chamber 8 is connected to sides of the load lock devices 6 and 7 opposite to sides of the load lock devices 6 and 7 connected to the transfer chamber 5. Further, ports 9, 10, and 11 for mounting thereon three carriers C are connected to a side of the loading/unloading chamber 8 opposite to a side of the loading/unloading chamber 8 connected to the load lock devices 6 and 7. The carrier is configured to accommodate therein wafers W as processing target substrates. Each of the vacuum processing units 1 to 4 is configured to perform a certain vacuum process such as an etching process or a film forming process on a wafer W as a processing target substrate that is mounted on a processing plate within each of the vacuum processing units 1 to 4.

As illustrated in FIG. 1, the vacuum processing units to 4 are connected to the four sides of the transfer chamber 5 via gate valves G, respectively. By opening the corresponding gate valves G, the vacuum processing units 1 to 4 are allowed to communicate with the transfer chamber 5. Further, by closing the corresponding gate valves G, the vacuum processing units 1 to 4 are isolated from the transfer chamber 5. The load lock devices 6 and 7 are connected to the other two sides of the transfer chamber 5 via first gate valves G1, respectively. Further, the load lock devices 6 and 7 are connected to the loading/unloading chamber 8 via second gate valves G2, respectively. By opening the first gate valves G1, the load lock devices 6 and 7 are allowed to communicate with the transfer chamber 5. Further, by closing the first gate valves G1, the load lock devices 6 and 7 are isolated from the transfer chamber 5.

Further, by opening the second gate valves G2, the load lock devices 6 and 7 are allowed to communicate with the loading/unloading chamber 8. Further, by closing the second gate valves G2, the load lock devices 6 and 7 are isolated from the loading/unloading chamber 8.

A transfer device 12 configured to load and unload the wafer W into/from the vacuum processing units 1 to 4 and the load lock devices 6 and 7 is provided within the transfer chamber 5. The transfer device 12 is provided at a substantially central portion of the transfer chamber 5. The transfer device 12 includes a rotatable and extendible/retractable member 13 capable of being rotated, extended, and retracted; and two supporting arms 14a and 14b, provided at leading ends of the rotatable and extendible/retractable member 13, for supporting the wafers W. The two supporting arms 14a and 14b are fastened to the rotatable and extendible/retractable member 13 so as to be oriented to opposite directions. An inside of the transfer chamber 5 is maintained at a certain vacuum level.

Each of the ports 9, 10, and 11 of the loading/unloading chamber 8 is provided with a non-illustrated shutter. FOUPs F accommodating therein the wafers W or empty FOUPs F are directly placed on the ports 9, 10, and 11, respectively. When the FOUPs F are placed, the shutters are opened, thus allowing the FOUPs F to communicate with the loading/unloading chamber 8 while preventing exterior air from entering. Further, an alignment chamber 15 is provided at a lateral side of the loading/unloading chamber 8 and is configured to align the wafers W.

A transfer device 16 configured to load and unload the wafer W into/from the FOUPs F and the load lock devices 6 and 7 and is disposed within the loading/unloading chamber 8. The transfer device 16 has a multi-joint arm structure and is configured to be movable along a rail 18 in an arrangement direction of the FOUPs F. The transfer device 16 transfers the wafer W while supporting the wafer W on a supporting arm 17 provided at a leading end thereof.

Individual components of this vacuum processing system, such as the vacuum processing units 1 to 4, the transfer chamber 5, a gas supply system or a gas exhaust system in the load lock devices 6 and 7, the transfer devices 12 and 16, and the gate valves are controlled by a controller 20 having a microprocessor (computer). The controller 20 includes a storage unit, an input unit, a display, and so forth. The storage unit stores therein process sequences of the vacuum processing system and process recipes as control parameters. The controller 20 controls the vacuum processing system according to a selected process recipe.

In the vacuum processing system configured as described above, the transfer device 16 takes out the wafer W from the FOUP F connected to the loading/unloading chamber 8 and loads the wafer W into a vessel 31 (see FIG. 2) of the load lock device 6 (or 7). At this time, an inside of the vessel 31 of the load lock device 6 is set to be in an atmospheric atmosphere. Then, the second gate valve G2 is opened and the wafer W is loaded into the load lock device 6.

Then, the inside of the vessel 31 is evacuated until an internal pressure thereof reaches a pressure corresponding to the transfer chamber 5. Afterward, the first gate valve G1 is opened and the wafer W is received by the transfer device 12 from the inside of the vessel 31. Then, after the gate valve G of one of the vacuum processing units 1 to 4 is opened, the wafer W is loaded into that vacuum processing unit and a high-temperature vacuum process such as a film forming process is performed on the wafer W therein.

Upon the completion of the vacuum process, the gate valve G is opened, and the transfer device 12 unloads the wafer W from the corresponding vacuum processing unit. Then, after the first gate valve G1 is opened, the transfer device 12 loads the wafer W into the vessel 31 of the load lock device 6 or 7.

Then, while cooling the wafer W by a cooling medium that flows through a cooling medium flow path 55 (see FIG. 2) of a cooling plate 32 (see FIG. 2), a purge gas is introduced into the vessel 31, and the inside of the vessel is turned to an atmospheric pressure (wafer cooling period). Then, the second gate valve G2 is opened and the processed wafer W is accommodated back into the FOUP F by the transfer device 16.

Here, as for the load lock devices 6 and 7, the load lock device 6 may be exclusively used for loading the wafers W while the load lock device 7 may be exclusively used for unloading the wafer W.

(Load Lock Device in Accordance With First Illustrative Embodiment)

Now, the load lock device in accordance with a first illustrative embodiment will be described.

Figure 2:
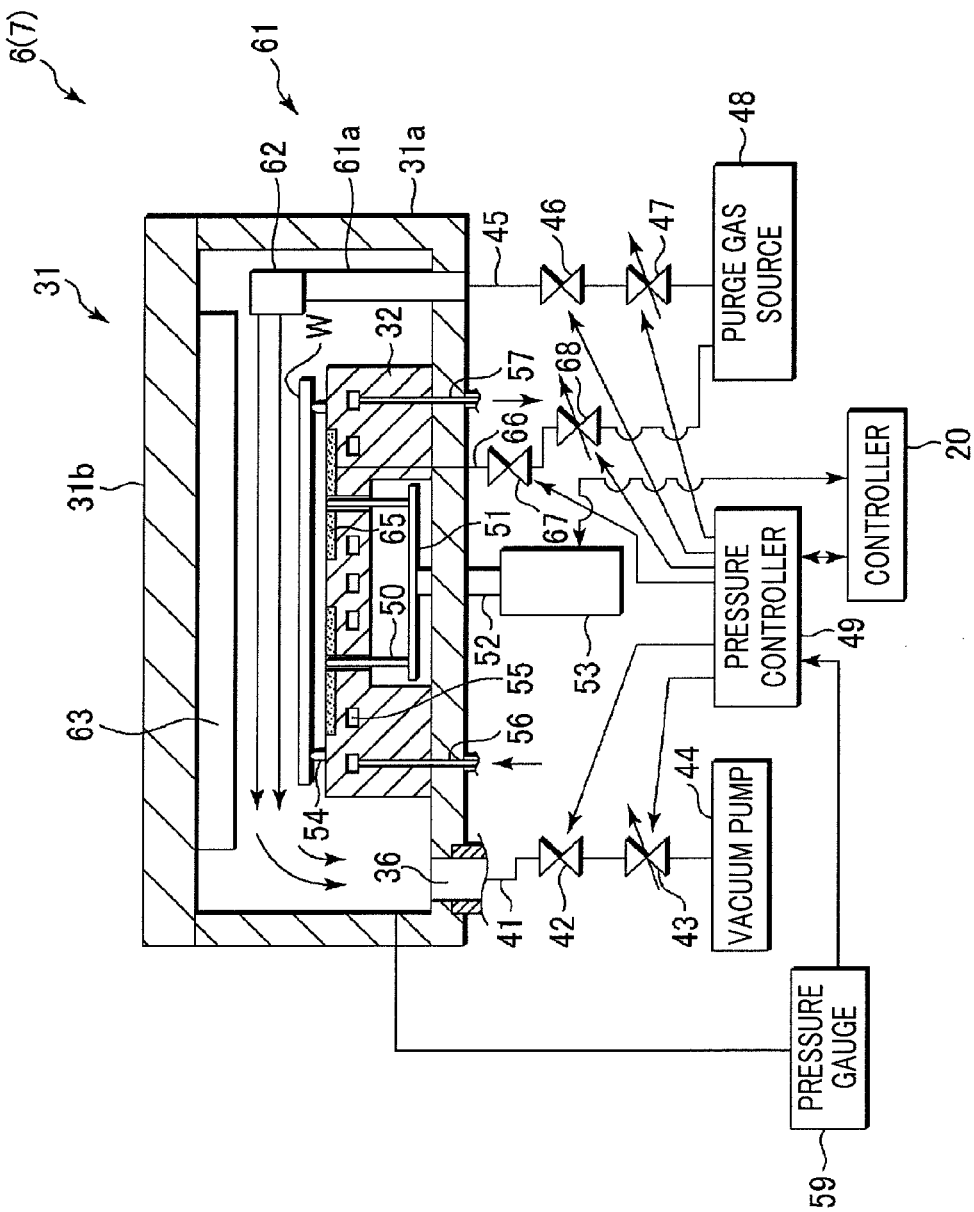
FIG. 2 is a longitudinal cross sectional view of a load lock device in accordance with a first illustrative embodiment.
Figure 3:
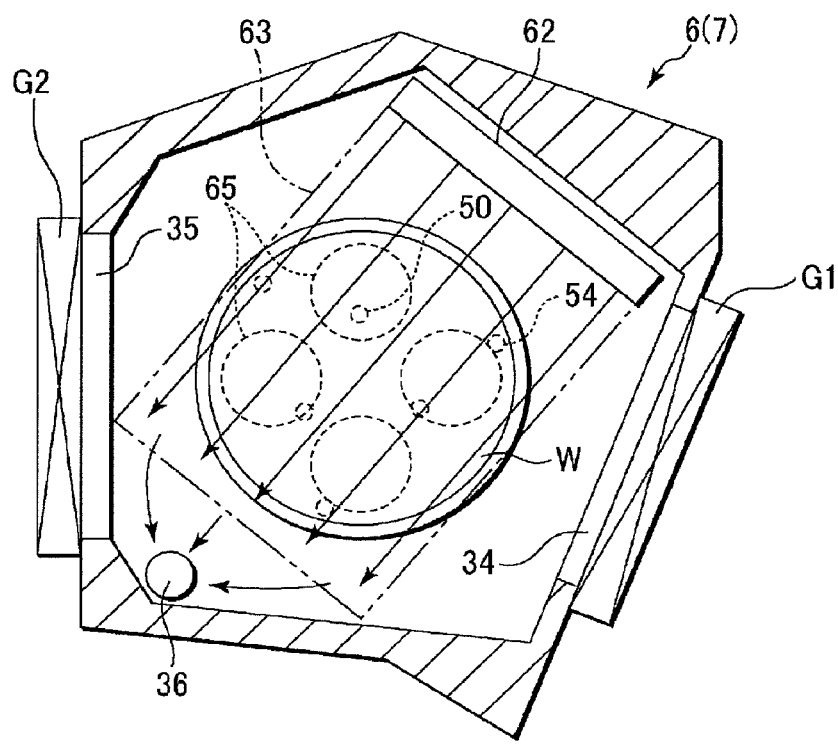
FIG. 3 is a transversal cross sectional view of the load lock device in accordance with the first illustrative embodiment.

FIGS. 2 and 3 provide a longitudinal cross sectional view and a transversal cross sectional view of the load lock device in accordance with the first illustrative embodiment, respectively. In accordance with the first illustrative embodiment, the load lock device 6(7) includes the vessel 31. The vessel 31 has a vessel main body 31a with a top open thereof; and a cover body 31b for closing the top open of the vessel main body 31a. The cooling plate (cooling member) 32 for cooling the wafer W placed at a position adjacent thereto is provided at a bottom of the vessel 31. The vessel 31 and the cooling plate 32 are formed of, e.g., aluminum or an aluminum alloy.

An opening 34 is formed at one sidewall of the vessel 31. Through the opening 34, the vessel 31 is capable of communicating with the transfer chamber 5 maintained in a vacuum state. Further, an opening 35 is formed at a sidewall of the vessel 31 opposite to the one sidewall of the vessel 31 where the opening 34 is formed. Through the opening 35, the vessel 31 is capable of communicating with the loading/unloading chamber 8 maintained in the atmospheric pressure. The opening 34 is opened and closed by the first gate valve G1, and the opening 35 is opened and closed by the second gate valve G2.

The cooling plate 32 has three wafer elevating pins 50 for transferring the wafer W (only two are shown in FIG. 2). The wafer elevating pins 50 are provided so as to be protrusible above and retractable below a front surface (top surface) of the cooling plate 32. The wafer elevating pins 50 are fastened to a supporting plate 51. By moving a rod up and down by a driving device 53 such as an air cylinder, the wafer elevating pins 50 are moved up and down via the supporting plate 51 between a transfer position and a cooling position. At the transfer position, the wafer elevating pins 50 are protruded above the front surface (top surface) of the cooling plate 32 and transfers the wafer W to/from the supporting arm 14a or 14b of the transfer device 12 in the transfer chamber 5 or to/from the supporting arm 17 of the transfer device 16 in the loading/unloading chamber 8 when the supporting arm 14a or 14b, or the supporting arm 17 enters the vessel 31. At the cooling position, the wafer elevating pins 50 are retracted below the cooling plate 32 to place the wafer W at a position adjacent to the front surface (top surface) of the cooling plate 32. Three wafer supporting pins 54 (only two are shown in FIG. 2) are provided on the top surface of the cooling plate 32. By providing the wafer supporting pins 54, the wafer W is located at the cooling position while slightly spaced apart from the cooling plate 3.2 (by, e.g., about 0.3 mm). Accordingly, it is possible to suppress particles from adhering to a rear surface of the wafer W.

The cooling medium flow path 55 is formed within the cooling plate 32 and is connected with a cooling medium inlet path 56 and a cooling medium outlet path 57. A cooling medium such as cooling water supplied from a non-illustrative cooling medium supply unit flows through the cooling medium flow path 55 to cool the wafer W located at the position adjacent to the cooling plate 32.

A gas exhaust port 36 for evacuating the inside of the vessel 31 is formed at the bottom of the vessel 31. The gas exhaust port 36 is connected with a gas exhaust line 41, and an opening/closing valve 42, a gas exhaust rate control valve 43, and a vacuum pump 44 are provided on the gas exhaust line 41. Accordingly, the inside of the vessel 31 can be evacuated at a certain exhaust rate by the gas exhaust rate control valve 43 and the vacuum pump 44.

Figure 4:
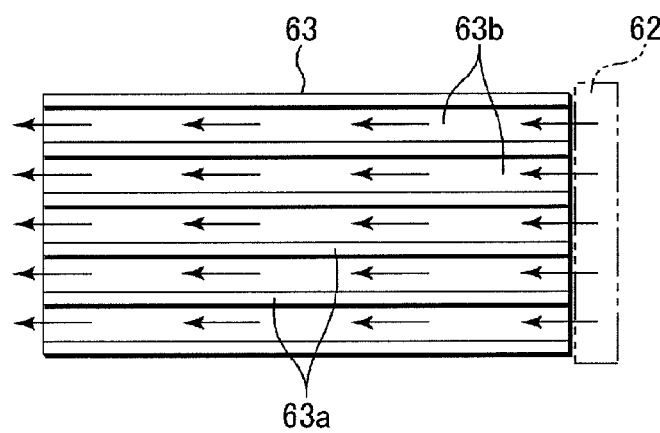
FIG. 4 is a bottom view of a rectifying plate used in the load lock device in accordance with the first illustrative embodiment.

Meanwhile, a first purge gas discharging member 61 for discharging the purge gas (e.g., a $N_2$ gas) is provided opposite to the gas exhaust port 36 with the cooling plate 32 therebetween at the bottom of the vessel 31. The first purge gas discharging member 61 includes a purge gas supply unit 61a upwardly extended from the bottom of the vessel 31; and a purge gas discharge nozzle 62 provided at a leading end of the purge gas supply unit 61a. The purge gas discharge nozzle 62 has a width substantially the same as a diameter of the wafer W. A purge gas supply line 45 is connected to the purge gas supply unit 61a from below. The purge gas supply line 45 is extended from a purge gas source 48, and an opening/closing valve 46 and a flow rate control valve 47 are provided on the purge gas supply line 45. With this configuration, the purge gas is supplied from the purge gas source 48 via the purge gas supply line 45 and the purge gas supply unit 61a while a flow rate thereof is controlled by the flow rate control valve 47. Further, the purge gas can be discharged from the purge gas discharge nozzle 62 to flow in parallel with the wafer W while controlling a turbulent flow thereof. Accordingly, the purge gas flow becomes a parallel flow in one direction and becomes a laminar flow or the controlled turbulent flow, or a mixture thereof. Further, the purge gas discharged from the purge gas discharge nozzle 62 can flow along the top surface of the wafer W. Provided directly under the cover body 31b is a rectifying plate 63 that controls the turbulent flow of the purge gas discharged from the purge gas discharge nozzle 62. The rectifying plate 63 includes, as depicted in a bottom view of FIG. 4, a multiple number of partition members 63a extended along a flow direction of the purge gas in a straight line shape. Flow paths 63b are formed between the partition members 63a. With this rectifying plate 63, the purge gas discharged from the purge gas discharge nozzle 62 is rectified. Even though the rectifying plate 63 is not provided, it may be still possible to allow the purge gas discharged from the purge gas discharge nozzle 62 to flow in parallel with the wafer W while controlling the turbulent flow thereof. However, by providing the rectifying plate 63, it is possible to more effectively control the turbulent flow of the purge gas.

Figure 5:
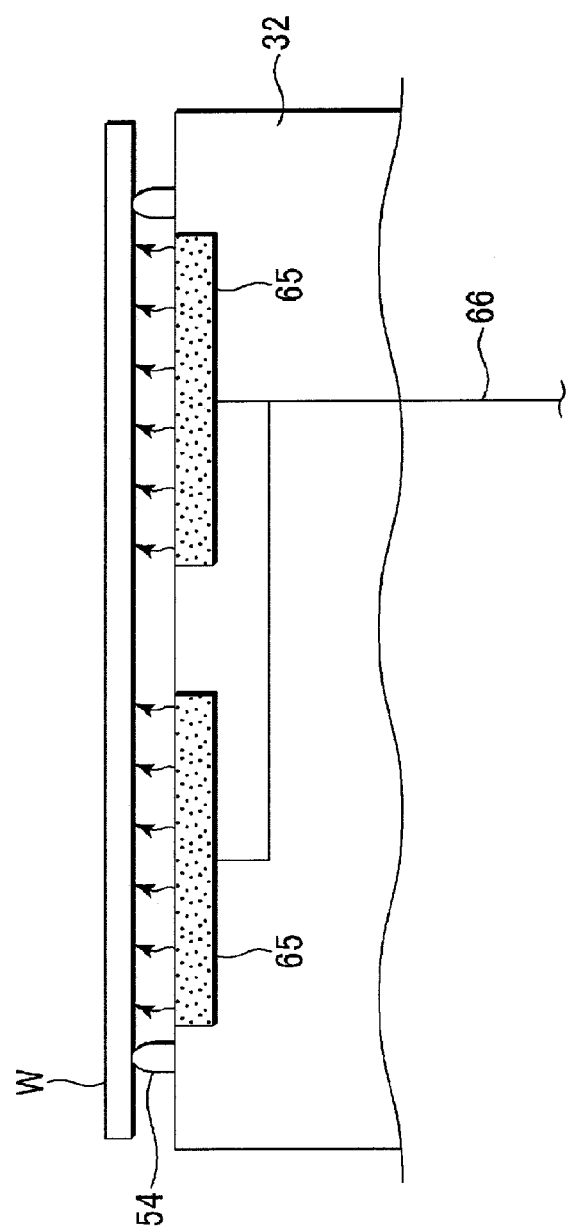
FIG. 5 is a schematic diagram illustrating a cooling plate having a purge gas discharging member used in the load lock device in accordance with the first illustrative embodiment.

Further, as depicted in FIG. 5, a second purge gas discharging member 65 formed of a. porous material such as a porous ceramic is provided in the top surface of the cooling plate 32. In the present illustrative embodiment, four circular purge gas discharging members 65 are arranged in a cross shape. However, the shape and the arrangement pattern of the second purge gas discharging members 65 may not be particularly limited as long as the purge gas can be discharged uniformly. By way of non-limiting example, the second purge gas discharging members 65 may have various shapes such as an oval shape, a rectangular shape or a slit shape, and may be arranged in, e.g., a three-way shape without being limited to the cross shape. Since the second purge gas discharging member 65 is formed of the porous material, the second purge gas discharging member 65 has a filtering function and serves to gently introduce the purge gas. The second purge gas discharging members 65 are connected to a purge gas supply line 66 that is extended from the purge gas source 48. An opening/closing valve 67 and a flow rate control valve 68 are provided on the purge gas supply line 66. With this configuration, the purge gas can be supplied from the purge gas source 48 via the purge gas supply line 66 while a flow rate thereof is controlled by the flow rate control valve 68, and can be gently discharged toward a bottom surface of the wafer W.

When a wafer W is transferred into/from the transfer chamber 5 that is maintained in a vacuum state, the opening/closing valves 46 and 47 are closed and the opening/closing valve 42 is opened. Then, by controlling the gas exhaust rate control valve 43, the inside of the vessel 31 is evacuated through the gas exhaust line 41 by the vacuum pump 44 at a certain evacuating rate and the internal pressure of the vessel 31 is set to be a certain pressure corresponding to the internal pressure of the transfer chamber 5. In this state, the first gate valve G1 is opened to allow the vessel 31 and the transfer chamber 5 to communicate with each other. Further, when the wafer W is transferred into/from the loading/unloading chamber 8 that is maintained in an atmosphere state, the opening/closing valve 42 is closed and the opening/closing valves 46 and 67 are opened. Then, by controlling the flow rate control valves 47 and 68, the purge gas such as a nitrogen gas is supplied from the purge gas source 48 toward the top surface and the bottom surface of the wafer W via the purge gas supply lines 45 and 66 at a certain flow rate and at a certain split ratio, respectively. Further, the internal pressure of the vessel 31 is increased to around the atmospheric pressure. In this state, the second gate valve G2 is opened to allow the vessel 31 and the loading/unloading chamber 8 to communicate with each other.

The internal pressure of the vessel 31 is controlled to have a certain pressure between the atmospheric pressure and a certain vacuum pressure by a pressure controller 49. The pressure controller 49 controls the internal pressure of the vessel 31 by controlling the opening/closing valve 42, the gas exhaust rate control valve 43, the flow rate control valves 47 and 68, and the opening/closing valves 46 and 67 based on the internal pressure of the vessel 31 measured by a pressure gauge 59. The pressure controller 49 is controlled by the controller 20.

Now, an operation of the load lock devices 6 and 7 in accordance with the present illustrative embodiment will be described.

First, the wafer W taken out of the FOUP F by the transfer device 16 is loaded into the vessel 31. At this time, the inside of the vessel 31 is set to be in the atmospheric atmosphere. After the second gate valve G2 is opened, the wafer W is loaded.

Then, the second gate valve G2 is closed, and the inside of the vessel 31 is evacuated until the internal pressure thereof reaches a pressure corresponding to the transfer chamber 5. Thereafter, the first gate valve G1 is opened, and the wafer W is unloaded from the vessel 31 by the supporting arm 14a or 14b of the transfer device 12. The high-temperature vacuum process such as a film forming process is performed on the unloaded wafer W in one of the vacuum processing units.

Thereafter, the inside of the vessel 31 is controlled to have a pressure corresponding to the transfer chamber 5. Then, after the first gate valve G1 is opened, the processed wafer W having a high temperature is loaded into the vessel 31. Then, while the internal pressure of the vessel 31 is increased to the atmospheric pressure by introducing the purge gas into the vessel 31, the wafer W is cooled. When the inside of the vessel 31 is turned to the atmospheric pressure and the wafer W is cooled to a certain temperature equal to or smaller than, e.g., about 100° C., the second gate valve G2 is opened and the wafer W is taken out of the vessel 31 by the supporting arm 17 of the transfer device 16. Then, the wafer W is accommodated in a certain FOUP F.

At this time, conventionally, the wafer W is cooled only by the cooling medium flowing in the cooling plate 32. If, however, the wafer W is placed at the position adjacent to the cooling plate 32 from the initial stage of the wafer cooling, the wafer W may be bent. Thus, at the initial stage, the wafer W needs to stand by a position above the cooling plate 32 while being supported by the wafer elevating pins 50. As a result, the wafer W cannot be cooled efficiently. Further, it is also possible to cool the wafer W by using the purge gas used for returning back the inside of the vessel 31 to the atmospheric pressure. Conventionally, however, if the purge gas is introduced into a vicinity of the wafer W in order to cool the wafer W efficiently, the particles may be blown up and adhere to the wafer W. For this reason, it is required to introduce the purge gas from a position far from the wafer W. As a result, the purge gas may not contribute to efficiently cooling the wafer W.

In accordance with the present illustrative embodiment, after the processed high-temperature wafer W is loaded into the vessel 31, when returning back the inside of the vessel 31 to the atmospheric atmosphere while cooling the wafer W, the purge gas supplied from the purge gas source 48 via the purge gas supply line 45 and the purge gas supply unit 61*a* is discharged from the purge gas discharge nozzle 62. Then, by rectifying the discharged purge gas by the rectifying plate 63, the laminar flow of the purge gas is formed in one direction while flowing in parallel with the wafer W and along the top surface of the wafer W toward the gas exhaust port 36. In this way, by forming the laminar flow that flows in parallel with the wafer W and along the top surface of the wafer W and forcibly convecting the laminar flow, a cooling layer is formed above the top surface of the wafer W. As a result, the wafer W can be effectively cooled by the convective heat transfer. At this time, since there is formed the cooling layer in the laminar flow state, it is possible to prevent the particles from being blown up. That is, the cooling layer above the top surface of the wafer W may also serve as a layer for preventing the particles from being blown up.

Meanwhile, the purge gas supplied from the purge gas source 48 is also supplied through the purge gas supply line 66. This purge gas is introduced toward the bottom surface of the wafer W from the second purge gas discharging members 65 formed of the porous material such as a porous ceramic. At this time, since the porous material has a rectifying function, the purge gas discharged from the second purge gas discharging members 65 may be gently supplied to the bottom surface of the wafer W in the laminar flow state. As a result, the cooling layer of the purge gas is formed below the bottom surface of the wafer W to cool the wafer W. At this time, since the purge gas is gently discharged from the second purge gas discharging members 65 in the laminar flow state, it is also possible to suppress the particles from being blown up. Accordingly, the purge gas discharged from the second purge gas discharging members 65 may efficiently contribute to cooling the wafer W without blowing up the particles.

In this way, it is possible to supply the purge gas to the wafer W without blowing up the particles, and also possible to cool the top surface and bottom surfaces of the wafer W by the purge gas. Accordingly, it is possible to cool the high-temperature wafer W more efficiently while preventing the particles from adhering to the wafer W. As a result, a throughput of a wafer process can be improved.

Figure 6:
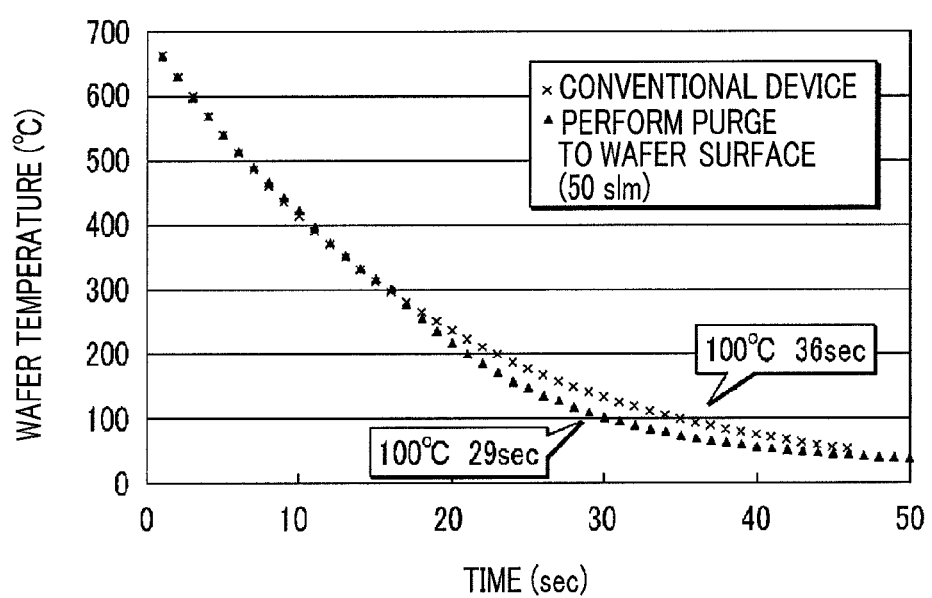
FIG. 6 is a graph showing results of investigating wafer cooling characteristics when a purge gas is not supplied to a top surface and a bottom surface of the wafer in a conventional case and wafer cooling characteristics when the purge gas is supplied to the top surface and the bottom surface of the wafer in the first illustrative embodiment.

FIG. 6 shows results of investigating wafer cooling characteristics when supplying the purge gas only from a purge gas inlet formed at the bottom of the vessel 31 in the conventional case and when additionally supplying the purge gas to the top surface and the bottom surface of the wafer W at a flow rate of, e.g., about 50 slm in the present illustrative embodiment. Further, FIG. 6 shows a temperature variation of the wafer W when cooling the wafer W having a high temperature of, e.g., about 700° C. As can be seen from FIG. 6, a temperature decrease in the present illustrative embodiment becomes larger than a temperature decrease in the conventional case after the temperature of the wafer W becomes about 250° C. A time taken until the temperature of the wafer W reaches about 100° C. where the wafer W can be taken out of the vessel 31 is found to be shortened by about 7 seconds from about 36 seconds to about 29 seconds.

Figure 7A:
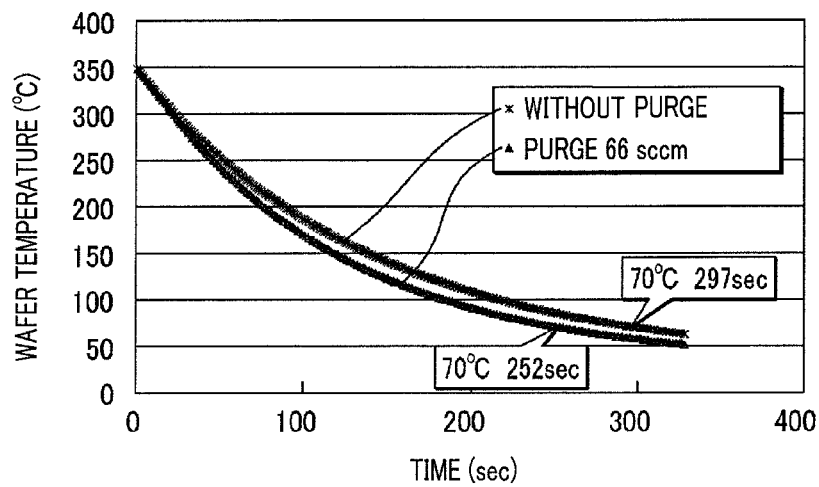
FIG. 7A is a graph showing calculating results of a convective heat transfer effect when supplying the purge gas from a purge gas inlet at a bottom of a vessel of a load lock device in a conventional case.
Figure 7B:
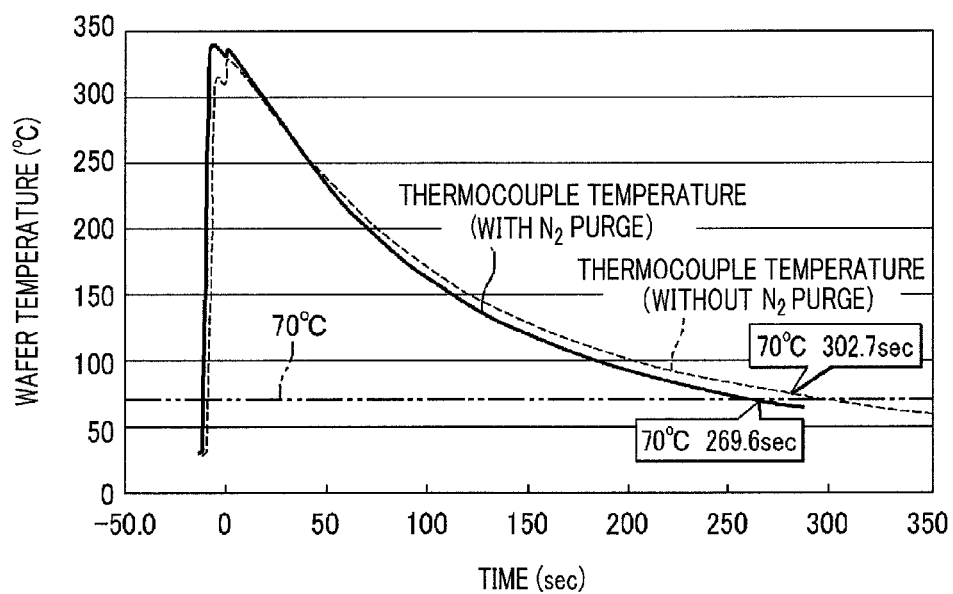
FIG. 7B is a graph showing actual measurement results of a convective heat transfer effect when supplying the purge gas from the purge gas inlet at the bottom of the vessel of the load lock device in the conventional case.

Then, there has been investigated a convective heat transfer effect when introducing the purge gas from the purge gas inlet at the bottom of the vessel 31 in the conventional case. FIG. 7A provides calculating results, and FIG. 7B provides actual measurement results. The actual measurement results of FIG. 7B show a comparison of the wafer cooling characteristics between when a $N_2$ purge is not performed and when a $N_2$ purge is performed with the $N_2$ gas flow rate of 12 slm. In both cases, the internal pressure of the vessel 31 is set to be the atmospheric pressure, and the $N_2$ gas is used as a purge gas. Further, in order to obtain FIG. 7A, a $N_2$ flow rate and a thermal conductivity are set based on the actual measurement results such that a cooling rate of the calculating results becomes approximately the actual measurement results, especially, a cooling time taken until the wafer temperature reaches about 70° C. becomes approximately the actual measurement results, for cases where the $N_2$ purge is performed and the $N_2$ purge is not performed. Here, the internal pressure of the vessel 31 is set to be the atmospheric pressure. From the calculating results of FIG. 7A, if the thermal conductivity is set so as to obtain the same results as the actual measurement results, a $N_2$ purge amount becomes about 66 sccm. That is, if the purge gas is introduced only from the purge gas inlet at the bottom of the vessel 31 as in the conventional case, the amount of the purge gas that actually contributes to cooling the wafer W is just about 5% of the total flow rate of the purge gas even if the flow rate of the purge gas is about 12 slm. Accordingly, the cooling efficiency conducted only by the purge gas introduced from the bottom of the vessel 31 is very low. From this result, the effect of directly supplying the purge gas to the top surface and the bottom surface of the wafer W as in the present illustrative embodiment would be understood.

In accordance with the first illustrative embodiment as described above, there is provided the first purge gas discharging member 61 having the purge gas discharge nozzle 62 for supplying the purge gas to the top surface of the wafer W to flow in parallel with the wafer W while controlling the turbulent flow of the purge gas. Further, there is also provided the second purge gas discharging member 65, formed of the porous material, for discharging the purge gas toward the bottom surface of the wafer W from below the wafer W located at the position adjacent to the cooling plate 32. With this configuration, the substrate can be efficiently cooled by the convective heat transfer of the laminar flow of the purge gas above the top surface of the wafer W or the controlled turbulent flow of the purge gas. Further, the purge gas layer may also serve as a layer for preventing the particles from being blown up. Moreover, since the rectified purge gas is gently supplied to the bottom surface of the wafer W from the second purge gas discharging member 65 formed of the porous material, it is possible to cool the wafer W efficiently without blowing up the particles. Accordingly, while suppressing the particles from adhering to the wafer W, the high-temperature substrate can be efficiently cooled, so that the throughput of the wafer process can be improved.

Further, in accordance with the first illustrative embodiment, although the purge gas is supplied to the top surface of the wafer W from the first purge gas discharging member 61 and to the bottom surface of the wafer W from the second purge gas discharging member 65, it may be possible to supply the purge gas only from the second purge gas discharging member 65. In such a case, since the rectified purge gas is gently supplied to the bottom surface of the wafer W, the wafer W can be cooled without blowing up the particles. Thus, it is possible to cool the high-temperature wafer W efficiently while suppressing the particles from adhering to the wafer W.

(Load Lock Device in Accordance With Second Illustrative Embodiment)

Now, a load lock device in accordance with a second illustrative embodiment will be described.

Figure 8:
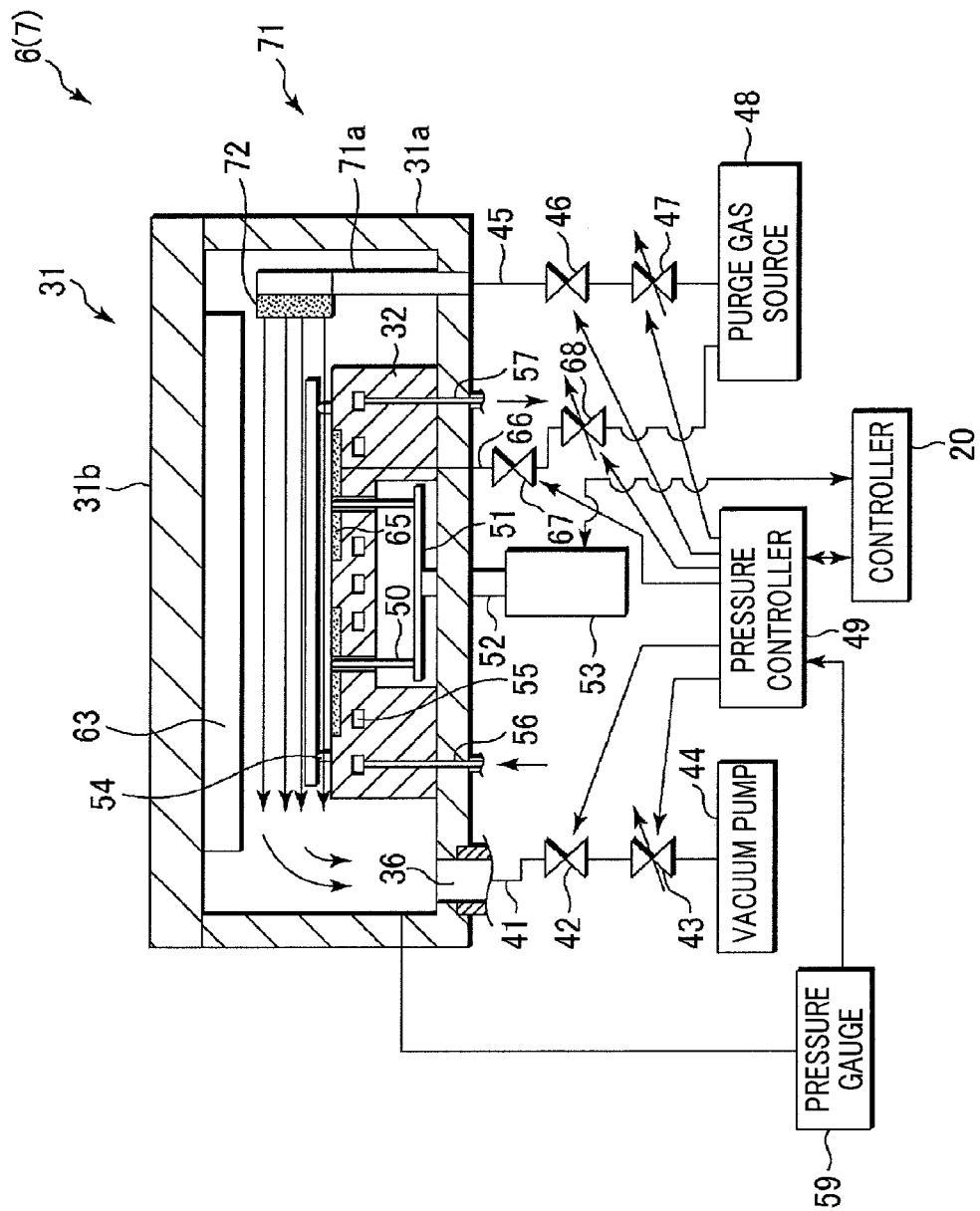
FIG. 8 is a longitudinal cross sectional view of a load lock device in accordance with a second illustrative embodiment.
Figure 9:
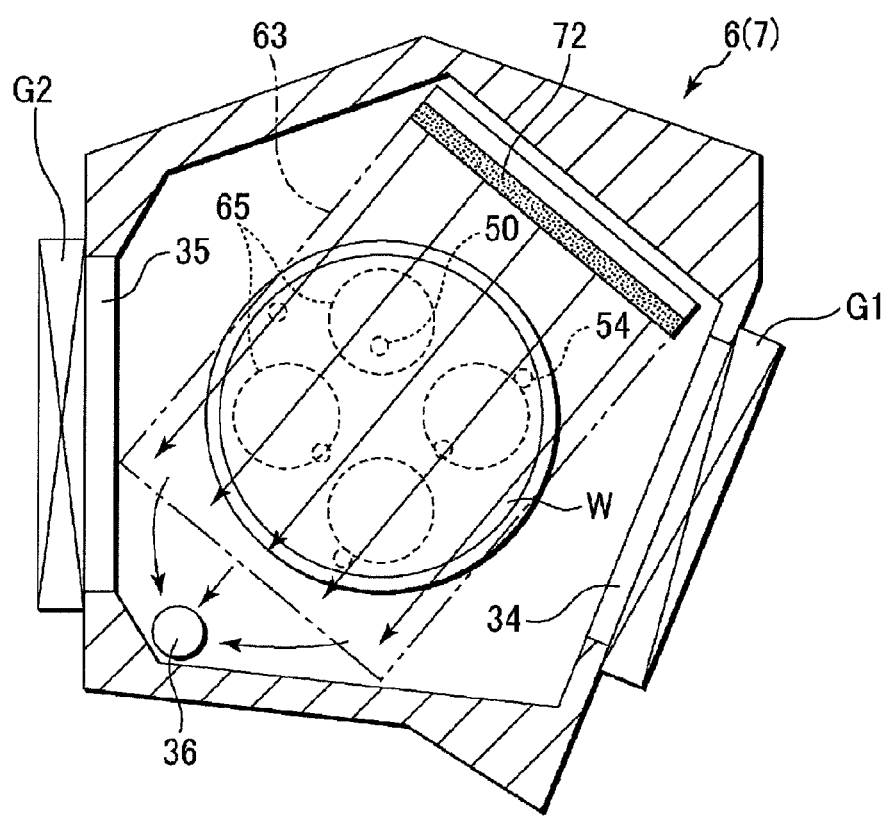
FIG. 9 is a transversal cross sectional view of the load lock device in accordance with the second illustrative embodiment.

FIGS. 8 and 9 provide a longitudinal cross sectional view and a transversal cross sectional view of the load lock device in accordance with the second illustrative embodiment, respectively. In FIGS. 8 and 9, parts substantially the same as those of the first illustrative embodiment will be assigned the same reference numerals as in FIGS. 2 and 3, and redundant description will be omitted.

The load lock device in accordance with the second illustrative embodiment includes a first purge gas discharging member 71 having a different structure from that of the first purge gas discharging member 61 in accordance with the first illustrative embodiment.

The first purge gas discharging member 71 is provided opposite to the gas exhaust port 36 with the cooling plate 32 therebetween at the bottom of the vessel 31. The first purge gas discharging member 71 includes a purge gas supply unit 71a upwardly extended from the bottom of the vessel 31; and a discharging unit 72 provided at the leading end of the purge gas supply unit 71a. The discharging unit 72 is formed of the porous material (e.g., porous ceramic) and has a width substantially the same as the diameter of the wafer W. The purge gas supply line 45 is connected to the purge gas supply unit 71a from below. The discharging unit 72 is extended in a range from a position above the wafer W and to a position below the wafer W.

The purge gas can be supplied from the purge gas source 48 via the purge gas supply line 45 and the purge gas supply unit 71a while a flow rate thereof is controlled by the flow rate control valve 47. Further, the purge gas can be discharged from the discharging unit 72 to flow in parallel with the wafer W while controlling the turbulent flow thereof. The discharging unit 72 is formed of the porous material. Further, since the discharging unit 72 is extended in the range from the position above the wafer W and to the position below the wafer W, the purge gas discharged from the discharging unit 72 can be supplied over an entire area of the wafer W while controlling the turbulent flow thereof. Accordingly, the purge gas flow becomes a parallel flow in one direction and becomes the laminar flow or the controlled turbulent flow, or the mixture thereof. Furthermore, as in the first illustrative embodiment, the rectifying plate 63 is provided directly under the cover body 31b. Here, without the rectifying plate 63, it may be still possible to allow the purge gas discharged from the discharging unit 72 to flow in parallel with the wafer W while controlling the turbulent flow thereof. However, by providing the rectifying plate 63, it is possible to more effectively control the turbulent flow of the purge gas.

In accordance with the second illustrative embodiment, after the processed high-temperature wafer W is loaded into the vessel 31, when returning back the inside of the vessel 31 to the atmospheric atmosphere while cooling the wafer W, the purge gas supplied from the purge gas source 48 via the purge gas supply line 45 and the purge gas supply unit 71a is discharged from the discharging unit 72 formed of the porous material. Then, by rectifying the discharged purge gas by the rectifying plate 63, the purge gas flow is formed in one direction while flowing in parallel with the wafer W and toward the gas exhaust port 36 over the entire area of the wafer W while controlling the turbulent flow thereof. In this way, by forming the purge gas flow that flows in parallel with the wafer W while controlling the turbulent flow thereof over the entire area of the wafer W and forcibly convecting the purge gas flow, the cooling layer by the laminar flow or the controlled turbulent flow is formed above the top surface and below the bottom surface of the wafer W. As a result, the wafer W can be effectively cooled by the convective heat transfer. At this time, since the porous material forming the discharging unit 72 has the rectifying function, the purge gas discharged from the discharging unit 72 flows gently, so that it is possible to suppress the particles from being blown up.

Meanwhile, as in the first illustrative embodiment, the purge gas supplied from the purge gas supply line 66 is supplied toward the bottom surface of the wafer W from the second purge gas discharging member 65 formed of the porous material such as a porous ceramic. Accordingly, the purge gas may be gently supplied to the bottom surface of the wafer W due to the rectifying function of the porous material. Further, since the cooling layer of the purge gas is formed on the bottom surface of the wafer W, it is possible to cool the wafer W without blowing up the particles.

In this way, it is possible to supply the purge gas to the wafer W without blowing up the particles and also possible to cool the top surface and bottom surfaces of the wafer W by the purge gas. Accordingly, it is possible to cool the high-temperature wafer W very efficiently while preventing the particles from adhering to the wafer W. As a result, the throughput of the wafer process can be improved.

Further, in this second illustrative embodiment, although the purge gas is supplied to the top surface of the wafer W from the first purge gas discharging member 71 and to the bottom surface of the wafer W from the second purge gas discharging member 65, it may be possible to supply the purge gas only from the second purge gas discharging member 65 formed of the porous material. In such a case, the wafer W can be efficiently cooled. Thus, it is possible to cool the high-temperature wafer W efficiently while suppressing the particles from adhering to the wafer W.

Furthermore, only with the first purge gas discharging member 71, by forming the laminar flow of the purge gas or the controlled turbulent flow of the purge gas to flow in parallel with the wafer W over the entire area of the wafer W and forcibly convecting the flow, the cooling layer may be formed on each of the top surface and bottom surfaces of the wafer W. Accordingly, it is possible to more efficiently cool the wafer W by the convective heat transfer. Further, since the porous material forming the discharging unit 72 has the rectifying function, the purge gas discharged from the discharging unit 72 flows gently so that the particles may be suppressed from being blown up. As a result, it is possible to cool the wafer W without blowing up the particles.

(Another Application)

Further, the above-described illustrative embodiments are not limited thereto and can be modified in various ways. By way of example, although the above illustrative embodiments have been described for the multi-chamber vacuum processing system including the four vacuum processing units and the two load lock devices, the number of the vacuum processing units and the load lock devices may not be limited thereto. Moreover, the load lock devices in accordance with the illustrative embodiments are not limited to the multi-chamber vacuum processing system, and may also be applicable to a vacuum processing system having only one vacuum processing unit. Furthermore, in the above-described illustrative embodiments, the laminar flow that flows in one direction is formed on the top surface of the wafer, but the illustrative embodiments are not limited thereto. By way of example, a multiple number of gas discharging members may be provided in the vicinity of the wafer, and by supplying the purge gas toward the top surface of the wafer from these gas discharging members, laminar flows of purge gas may be formed on the top surface of the wafer. Moreover, the processing target substrate may not be limited to the semiconductor wafer, but various substrates such as a glass substrate for FPD may be used.

What is claimed is:

1. A load lock device used when a substrate is transferred from an atmospheric atmosphere into a vacuum chamber maintained in a vacuum state and when the substrate is transferred from the vacuum chamber into the atmospheric atmosphere, the load lock device comprising:
    a vessel of which an internal pressure is variable between a pressure corresponding to the vacuum chamber and an atmospheric pressure;
    a purge gas supply unit configured to supply a purge gas into the vessel;
    an exhaust device configured to evacuate an inside of the vessel;
    a pressure controller configured to adjust the internal pressure of the vessel to be the pressure corresponding to the vacuum chamber when the inside of the vessel communicates with the vacuum chamber and configured to adjust the internal pressure of the vessel to be the atmospheric pressure when the inside of the vessel communicates with a space under the atmospheric atmosphere by controlling the purge gas supply unit and the exhaust device;
    a cooling member, having a cooling device, provided within the vessel and configured to cool the substrate while the substrate is placed adjacent thereto;
    a first purge gas discharging member configured to discharge the purge gas supplied from the purge gas supply unit to flow in parallel with the substrate while controlling a turbulent flow of the purge gas; and
    a second purge gas discharging member formed of a porous material and configured to discharge the purge gas toward a bottom surface of the substrate from below the substrate placed adjacent to the cooling member,
    wherein the second purge gas discharging member is provided in an upper portion of the cooling member.

2. The load lock device of claim 1,
    wherein the first purge gas discharging member includes a purge gas discharge nozzle configured to discharge the purge gas supplied from the purge gas supply unit along a top surface of the substrate while controlling the turbulent flow of the purge gas.

3. The load lock device of claim 2,
    wherein the purge gas discharge nozzle is also configured to discharge the purge gas such that a flow of the purge gas is formed on the top surface of the substrate in one direction to flow in parallel with the substrate.

4. The load lock device of claim 3, further comprising:
    a rectifying member configured to rectify the flow of the purge gas that is discharged from the purge gas discharge nozzle and formed on the top surface of the substrate.

5. The load lock device of claim 1,
    wherein the first purge gas discharging member includes a discharging unit formed of the porous material and is configured to discharge the purge gas from the discharging unit.

6. The load lock device of claim 5,
    wherein the discharging unit is formed of a porous ceramic.

7. The load lock device of claim 5,
    wherein the discharging unit is disposed so as to form a flow of the discharged purge gas over an entire area of the substrate while controlling the turbulent flow of the purge gas.

8. The load lock device of claim 7,
    wherein the discharging unit is configured to discharge the purge gas such that the flow of the purge gas is formed over the entire area of the substrate in one direction to flow in parallel with the substrate.

9. The load lock device of claim 8, further comprising:
    a rectifying member configured to rectify the flow of the purge gas that is discharged from the discharging unit and formed on a top surface of the substrate.

10. The load lock device of claim 1,
    wherein the second purge gas discharging member is formed of a porous ceramic.

11. A load lock device used when a substrate is transferred from an atmospheric atmosphere into a vacuum chamber maintained in a vacuum state and when the substrate is transferred from the vacuum chamber into the atmospheric atmosphere, the load lock device comprising:
    a vessel of which an internal pressure is variable between a pressure corresponding to the vacuum chamber and an atmospheric pressure;
    a purge gas supply unit configured to supply a purge gas into the vessel;
    an exhaust device configured to evacuate an inside of the vessel;
    a pressure controller configured to adjust the internal pressure of the vessel to be the pressure corresponding to the vacuum chamber when the inside of the vessel communicates with the vacuum chamber and configured to adjust the internal pressure of the vessel to be the atmospheric pressure when the inside of the vessel communicates with a space under the atmospheric atmosphere by controlling the purge gas supply unit and the exhaust device;
    a cooling member, having a cooling device, provided within the vessel and configured to cool the substrate while the substrate is placed adjacent thereto; and
    a purge gas discharging member formed of a porous material and configured to discharge the purge gas toward a bottom surface of the substrate from below the substrate placed adjacent to the cooling member,
    wherein the purge gas discharging member formed of the porous material is provided in an upper portion of the cooling member.

12. The load lock device of claim 11,
    wherein the purge gas discharging member formed of the porous material is formed of a porous ceramic.

* * * * *